United States Patent [19]

Seldin

[11] Patent Number: 5,221,811
[45] Date of Patent: Jun. 22, 1993

[54] SHOCK MOUNTING HOUSING APPARATUS

[75] Inventor: George R. Seldin, Fullerton, Calif.

[73] Assignee: Data Lease Systems and Financial Corporation, Placentia, Calif.

[21] Appl. No.: 819,831

[22] Filed: Jan. 13, 1992

[51] Int. Cl.$^5$ ............................................. H05K 5/00
[52] U.S. Cl. ................................... 174/52.1; 428/159; 361/417
[58] Field of Search ............... 428/158, 159, 160; 174/35 GC, 52.1, 50; 277/227, 228, 229, 901; 361/380, 390, 394, 399, 417, 418

[56] References Cited

U.S. PATENT DOCUMENTS

| | | | |
|---|---|---|---|
| 4,604,940 | 8/1986 | Mendelsohn et al. | 528/66 |
| 5,041,924 | 8/1991 | Blackborow ete al. | 360/69 |
| 5,112,933 | 5/1992 | O'Donnell et al. | 528/61 |
| 5,129,116 | 7/1992 | Borders et al. | 5/617 |

Primary Examiner—Leo P. Picard
Assistant Examiner—Bot L. Ledynh
Attorney, Agent, or Firm—G. Donald Weber, Jr.

[57] ABSTRACT

A unique housing apparatus for mounting of sensitive electronic equipment includes a polymer gasket which, when combined with the housing, isolates the electronic devices mounted therein from shock, vibration and cavitation. The polymer gasket includes characteristics wherein shock waves are dissipated along parallel planes of the polymer rather than in the normal direction of the polymer.

15 Claims, 1 Drawing Sheet

SHOCK MOUNTING HOUSING APPARATUS

BACKGROUND

1. Field of the Invention.

This invention is directed to a housing apparatus for sensitive equipment, in general, and to a shock-mounting housing apparatus which dissipates vibration and shock waves from sensitive electronic and/or electromechanical equipment, in particular.

2. Prior Art.

With the advent of electronic and electromechanical machinery of more and greater degrees of sensitivity, it has become necessary to protect these devices from various and sundry environmental conditions. These conditions include temperature, humidity, light, dark, static electrical charge and, as well, shock caused by mechanical impact.

Many devices and techniques have been used to eliminate or at least significantly reduce the damage or degradation of the product as a result of these environmental conditions.

In particular regard to the shock mounting vibration damping aspects, many devices have been arranged to include impact-absorbent materials on the "feet" of the apparatus. In addition, in many cases the housing apparatus has been permitted to "float" so as to prevent the transmission of the physical impact or shock from a base or support system to the package, per se. In other cases, the contents of the housing apparatus have been permitted to float. To accomplish this, the contents (or inner workings) have been individually shock mounted by means of rubber grommets or the like.

However, each of these known techniques still includes the shortcoming that an undesirable impact or vibration on the housing can still be transmitted to the apparatus mounted therein. Typically, the impact to the housing is in a particular direction which is normal to a plane of the housing and, thus, the apparatus mounted therein. Irrespective of the type of shook mounting known in the past, the shook waves produced by such an impact still tend to pass through the housing in the direction of the impact. This frequently has a deleterious effect on some or all of the items mounted within the housing. Thus, despite all efforts known in the past, the shock mounting devices currently available are not fully functional in the fashion desired.

PRIOR ART STATEMENT

A formal patentability search in this invention has not been conducted although a survey of industry-available products has been conducted and no pertinent prior art has been discovered.

SUMMARY OF THE INVENTION

A gasket is included in a housing apparatus to provide shock mounting capabilities. The gasket is, typically, formed of a polymer such as polyurethane. The polymer gasket can be fabricated of multiple layers of different types of polymers, such as a soft polymer and a dense polymer. By using the multi-layer gasket, enhanced protection is provided.

In addition, by mounting the devices to be protected, such as, but not limited to, disk drives, to angulated brackets by means of gaskets which brackets and gaskets include holes therethrough, the devices can be arranged to be substantially shock mounted and also to provide adequate environmental control in terms of air circulation and the like.

DESCRIPTION OF A PREFERRED EMBODIMENT

Figure 1:
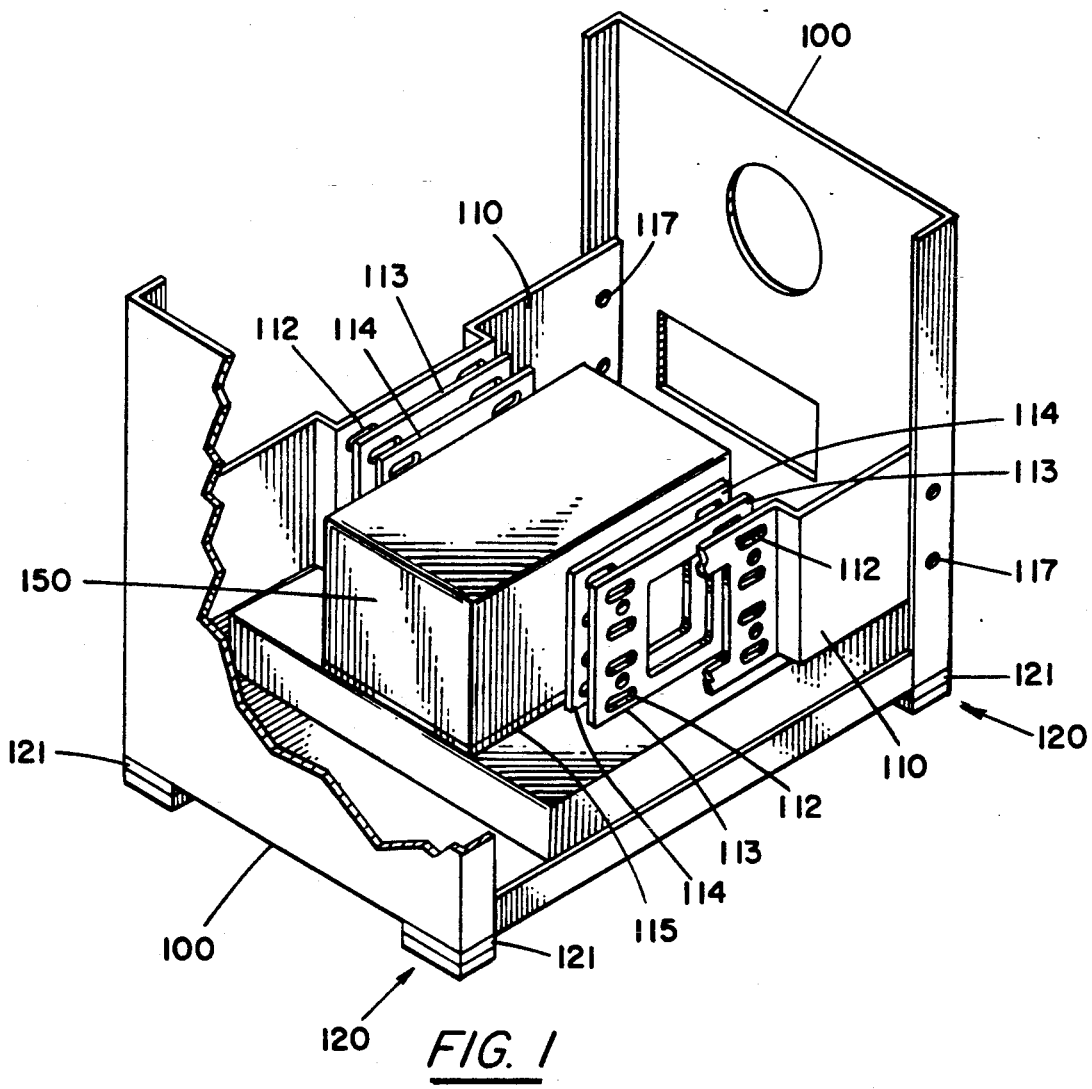
FIG. 1 is a partially broken away, partially exploded schematic representation of a typical housing apparatus using the instant invention.

Referring now to FIG. 1, there is shown a partially broken away, partially exploded view of a typical housing apparatus 100 or the like which utilizes the instant invention.

The housing 100 (shown partially broken away) is an outer housing or casing for any type of internally mounted device 150. In a typical utilization of the invention, the housing 100 is used to mount a disk drive (device 150) used with a computer system or the like. The housing 100 is, typically, formed of sheet metal such as aluminum or the like. The housing 100 includes typical sides, bottoms, tops, front and rear panels, portions of which are not shown for purposes of clarity. These panels may have the appropriate openings therein to facilitate the insertion of the disk drive (or other apparatus). In addition, the housing 100 may include appropriate support structures 120 such as "feet" or the like. Likewise, the housing 100 may be adapted for rack mounting, stand-alone construction or whatever is desired. Incidentally, the housing 100 shown in FIG. 1 can represent the outer casing for a housing, internal panels for housing or the like.

A typical, relatively sensitive, electromechanical device 150 is shown as a generally rectilinear component to be mounted within housing 100. The unit 150 can be a disk drive or any other suitable device.

In the instant embodiment, the mounting apparatus includes at least one support bracket 110 which is mounted to the housing 100 by any suitable means such as nuts and bolts, rivets, spot welding or the like. A representative mounting 117 is shown. A counterpart support bracket 110 is arranged on the opposite side of the disk drive component 150. The counterpart support bracket may or may not be necessary depending upon the specific mounting techniques, the component 150, the housing 100 and so forth.

The bracket 110 includes a plurality of openings 112 in a portion thereof. These apertures or openings are specially adaptable to provide airflow around the component 150 so as to enhance cooling or other temperature control. By such temperature control, the integrity of the component 150 is enhanced.

Also, interposed between the mounting brackets 110 and the component 150 are one or more gaskets 113 and 114. Typically, both of these gaskets are made of a polymer material such as polyurethane with a density or thickness of 18 Shore A on the Durometer scale. Typically, the gasket 114 is a soft polymer, while the gasket 113 is a dense polymer. In addition, a polymer pad 115 is disposed beneath the component 150 in this embodiment.

The gaskets 113 and/or 114 can be mounted to the bracket 110 by means of suitable fasteners or by means of a suitable adhesive such as a cyanoacrylate instant adhesive. If mechanical fasteners are utilized to mount the gaskets, they must not engage both the bracket 110 and the device 150. Typically, these mechanical fasteners are recessed into the gasket which abuts the device 150. When adhesives are utilized, the gaskets are glued together and then to bracket 110. Device 150 is free to be removed from the housing for repair if needed.

Obviously, additional pads or gaskets of the polymer can be inserted in other places adjacent to the component 150 and/or among other areas in the apparatus. For example, a layer 121 of polymer or the like can also be inserted between the casing 100 and any mounting feet 120 attached to the casing.

Figure 2:
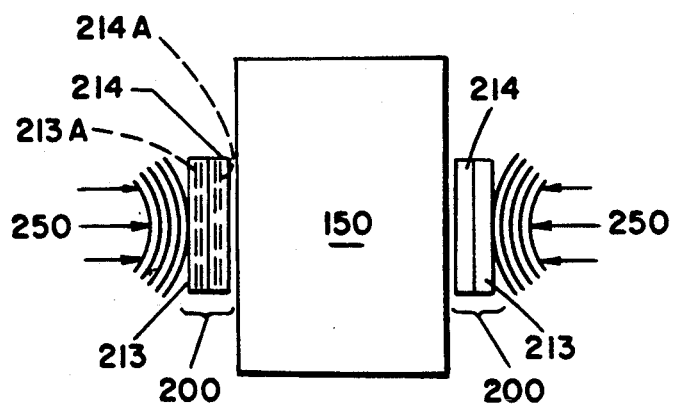
FIG. 2 is a schematic representation of the effect of using a gasket in the instant invention.

Referring now to FIG. 2, there is shown a schematic representation of the apparatus shown in FIG. 1. This view includes gaskets 200 which are utilized with the apparatus and disposed between the device 150 and the housing 10 (see FIG. 1). In this case, the gasket 200 comprises a soft polymer layer 214 and a dense polymer layer 213. It must be understood that gasket 200 can be fabricated of either layer 213 or layer 214. The gasket layers can be adhered to each other by an suitable adhesive. In some cases, the gaskets can be mounted in the apparatus without any further fastening means. (These mounting techniques are omitted in FIG. 1.)

As shown in FIG. 2, a shock wave 250 is applied to the gasket 200. In this case, the shock wave is substantially normal or perpendicular to the plane of the gasket. Relating this situation to the apparatus shown in FIG. 1, the shock wave 250 represents a blow received at the side (for example) of the housing 100 and substantially normal thereto.

In the prior art, this shock wave or vibration would have been transmitted to the device 150 through whatever shock mounting was utilized. However, in the case of the gasket 200, the normal or perpendicular shock wave 210 is caused to dissipate in parallel lines or waves (represented by dashed lines 213A and 214A) across the plane of the gasket. In other words, the perpendicular blow 250 is not transferred through the gasket 200, but is dissipated therealong.

Even in the instance of a neoprene or similar type of gasket known in the prior art, the shock wave 250 would be, perhaps, lessened in impact. However, the shock wave would be transmitted through the gasket to the component 150 (or other apparatus within housing 100). Contrariwise, in this invention, the shock wave 250 is dissipated along the planes 213A and 214A of the gasket 200 so that the impact on the component 150 (or other components) is minimized if not altogether eliminated.

By placing the gasket of the type described therein at strategic locations or completely surrounding the sensitive electromechanical devices 150, the mechanical impact thereon is diminished and the apparatus will continue to function properly despite the impact.

While the preferred embodiment comprises a gasket 200 which includes a soft polymer layer 213 and a dense polymer layer 214, it is clear that a gasket 200 using only one or the other of these polymers will provide an advantageous function. The use of a single layer gasket is, of course, subject to limitations since the necessary thickness and hardness required cannot be attained by this method.

Thus, there is shown and described a unique design and concept of a housing apparatus for mounting of sensitive electrical equipment. The particular configuration shown and described herein relates to a shock-mounting apparatus which dissipates shock waves and vibration from sensitive electronic and/or electromechanical equipment. The materials can be used as gaskets, spring mountings, rubber bushings or the like. While this description is directed to a particular embodiment, it is understood that those skilled in the art may conceive modifications and/or variations to the specific embodiments shown and described herein. Any such modifications or variations which fall within the purview of this description are intended to be included therein as well. It is understood that the description herein is intended to be illustrative only and is not intended to be limitative. Rather, the scope of the invention described herein is limited only by the claims appended hereto.

I claim:

1. A shock mounting apparatus comprising,
a housing for supporting a sensitive device therein, and
gasket means mounted between said housing and said sensitive device,
said gasket means is formed of multiple layers of polymer material,
at least two of said layers are comprised of polymers which have different densities,
said gasket is formed of a polymer material which converts perpendicular shock waves to planar shock waves within said gasket.

2. The apparatus recited in claim 1 wherein,
said gasket means comprises a plurality of gasket components mounted between different portions of said housing and said sensitive device.

3. The apparatus recited in claim 1 wherein,
said sensitive device comprises an electronic device.

4. The apparatus recited in claim 1 including,
bracket means mounted intermediate said housing and said bracket means.

5. The apparatus recited in claim 4 wherein,
said bracket means includes apertures therethrough to enhance airflow around said sensitive device.

6. The apparatus recited in claim 5 wherein,
said gasket means includes apertures therethrough to enhance airflow around said sensitive device.

7. The apparatus recited in claim 1 including,
further gasket means mounted to a bottom surface of said housing.

8. The apparatus recited in claim 7 wherein,
said gasket means and said further gasket means are formed of the same material.

9. The apparatus recited in claim 1 wherein,
at least one of said layers comprises a soft polymer, and
at least one of said layers comprises a dense polymer.

10. The apparatus recited in claim 1 wherein,
said bracket means is mounted to said housing.

11. The apparatus recited in claim 10 wherein,
said gasket means is adhered to said support brackets by adhesive means.

12. The apparatus recited in claim 1 including,
support feet attached to the bottom of said housing.

13. The apparatus recited in claim 12 including,
additional gasket means interposed between said support feet and said housing.

14. The apparatus recited in claim 13 wherein,
said gasket means and said additional gasket means are formed of the same material.

15. The apparatus recited in claim 1 wherein,
said sensitive device is readily removable from said housing and gasket means.

* * * * *